(12) United States Patent
Peng et al.

(10) Patent No.: US 10,468,378 B2
(45) Date of Patent: Nov. 5, 2019

(54) METHOD FOR PREPARING A SEMICONDUCTOR PACKAGE

(71) Applicant: INPAQ TECHNOLOGY CO., LTD., Miaoli (TW)

(72) Inventors: Yu-Ming Peng, Taichung (TW); Chu-Chun Hsu, Toufen Township, Miaoli County (TW); Hung-Shung Ko, Hemei Township, Changchua County (TW); Hsiu-Lun Yeh, Pingzhen (TW)

(73) Assignee: INPAQ TECHNOLOGY CO., LTD., Miaoli (TW)

( * ) Notice: Subject to any disclaimer, the term of this patent is extended or adjusted under 35 U.S.C. 154(b) by 5 days.

(21) Appl. No.: 15/660,248

(22) Filed: Jul. 26, 2017

(65) Prior Publication Data

US 2018/0269180 A1 Sep. 20, 2018

(30) Foreign Application Priority Data

Mar. 16, 2017 (TW) .............................. 106108726 A

(51) Int. Cl.
| | |
|---|---|
| *H01L 23/00* | (2006.01) |
| *H01L 21/78* | (2006.01) |
| *H01L 23/498* | (2006.01) |
| *H01L 23/29* | (2006.01) |
| *H01L 23/31* | (2006.01) |
| *H01L 21/56* | (2006.01) |
| *H01L 21/48* | (2006.01) |

(52) U.S. Cl.
CPC .............. *H01L 24/97* (2013.01); *H01L 21/78* (2013.01); *H01L 23/293* (2013.01); *H01L 23/3121* (2013.01); *H01L 23/49838* (2013.01); *H01L 21/4867* (2013.01); *H01L 21/561* (2013.01); *H01L 23/49816* (2013.01); *H01L 23/49827* (2013.01); *H01L 2224/16225* (2013.01); *H01L 2224/48091* (2013.01); *H01L 2224/48227* (2013.01); *H01L 2224/73265* (2013.01)

(58) Field of Classification Search
CPC . H01L 24/97; H01L 23/3121; H01L 21/4867; H01L 23/293; H01L 21/78; H01L 21/561; H01L 23/49838
See application file for complete search history.

(56) References Cited

U.S. PATENT DOCUMENTS

| | | | | |
|---|---|---|---|---|
| 2011/0089555 A1* | 4/2011 | Shau | ..................... | H01L 21/561 257/690 |
| 2011/0315956 A1* | 12/2011 | Tischler | .............. | H01L 23/4985 257/13 |
| 2012/0186078 A1* | 7/2012 | Shau | ................. | H01L 21/76898 29/830 |

(Continued)

*Primary Examiner* — Latanya N Crawford
(74) *Attorney, Agent, or Firm* — Muncy, Geissler, Olds & Lowe, P.C.

(57) ABSTRACT

The present disclosure provides a method for preparing a semiconductor package having a standard size from a die having a size smaller than the standard size. The method includes: providing a wafer; forming a die on the wafer, wherein the die has a size smaller than one-half of a standard size 0201; dicing the die from the wafer; encapsulating the die to form an encapsulated die; and singulating the encapsulated die to form a semiconductor package having a size equal to or larger than the standard size 0201.

11 Claims, 10 Drawing Sheets

(56) References Cited

U.S. PATENT DOCUMENTS

| | | | | |
|---|---|---|---|---|
| 2013/0001632 A1* | 1/2013 | Imai | ................ | H01L 33/62 |
| | | | | 257/99 |
| 2013/0016494 A1* | 1/2013 | Speier | ................ | H01L 25/0753 |
| | | | | 362/84 |
| 2013/0277829 A1* | 10/2013 | Yee | ................ | H01L 23/49827 |
| | | | | 257/737 |
| 2014/0077235 A1* | 3/2014 | Kwon | ................ | H01L 33/0095 |
| | | | | 257/88 |
| 2015/0260382 A1* | 9/2015 | Hino | ................ | H05K 1/09 |
| | | | | 362/382 |
| 2016/0035697 A1* | 2/2016 | Lien | ................ | H01L 21/56 |
| | | | | 438/113 |

* cited by examiner

METHOD FOR PREPARING A SEMICONDUCTOR PACKAGE

CROSS-REFERENCE TO RELATED APPLICATION

The present application is based on, and claims priority from, Taiwan Patent Application Serial Number 106108726, filed on Mar. 16, 2017, the disclosure of which is hereby incorporated by reference herein in its entirety.

TECHNICAL FIELD

The present disclosure generally relate to a method for preparing a semiconductor package, and more particularly, to a method for preparing a semiconductor package having a standard size from a die having a size smaller than the standard size.

DISCUSSION OF THE BACKGROUND

Within the electronics industry, vigorous development has focused on multi-functional and high-performance capabilities of electronic products. To meet the integration and miniaturization packaging requirements of semiconductor package structures, circuit board designs for carrying active and passive components and wirings have evolved from single-layer to multi-layer board designs. With a multi-layer board, an area of wire routing can be expanded in a limited space on the circuit board by employing an interlayer connection technique, which also complies with the requirements of high-density integrated circuits.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for preparing a semiconductor package. In one embodiment of the present disclosure, the method comprises steps of providing a wafer; forming a die on the wafer, wherein the die has a size smaller than one-half of a standard size 0201; singulating the die from the wafer; encapsulating the die to form an encapsulated die; and singulating the encapsulated die to form a semiconductor package having a size equal to or larger than the standard size 0201.

In one embodiment of the present disclosure, the size of the die is a standard size 01005.

In one embodiment of the present disclosure, the size of the semiconductor package is equal to or larger than a standard size 0402 or a standard size DFN 10.

In one embodiment of the present disclosure, the method comprises providing a carrier substrate; forming a conductive element on the carrier substrate; and attaching the die to the conductive element.

In one embodiment of the present disclosure, the step of encapsulating the die comprises using a protecting material to encapsulate the die.

In one embodiment of the present disclosure, the protecting material comprises polyimide, epoxy resin, benzocyclobutene (BCB) and polymer.

In one embodiment of the present disclosure, the carrier substrate comprises a conductive carrier or a non-conductive carrier.

In one embodiment of the present disclosure, the conductive carrier comprises a printed circuit board (PCB).

In one embodiment of the present disclosure, the step of forming a conductive element on the carrier substrate comprises: performing a paste printing process or screen printing process to form a conductive element.

In one embodiment of the present disclosure, the paste printing process or the screen printing process uses silver or tin.

In one embodiment of the present disclosure, the die is electrically connected to the carrier substrate through the conductive element and free from a wire.

The present disclosure also provides a method for preparing a semiconductor package with a new structure. Regardless whether the desired package size is the standard size 0201, or a larger standard size such as 0402 or DFN10, and even with limited wafer area, the present disclosure still can provide more dies by the method, and sizes of the dies after the singulation process can meet the desired package size. In view of this, the disclosed semiconductor package can be prepared by the method capable of reducing the manufacturing cost. Furthermore, the die is encapsulated without high dielectric constant materials, but instead using protecting materials of the dry film process. Accordingly, the parasitic effect is relatively insignificant. In addition, the present disclosure uses conductive elements instead of conductive wirings to electrically connect the die and the carrier substrate, so that the parasitic effect is not likely to occur. For this reason, when the die operates at a high frequency, the influence of the parasitic effect on the die is relatively small, so the electrical performance is improved.

In contrast, in conventional semiconductor packages, the size of the die is equal to that of the semiconductor package. For instance, if the size of the semiconductor package is the standard size 0201, the size of the die is the standard size 0201 as well. Accordingly, with wafer sections of comparable size, a greater number of dies can be cut from a wafer according to the disclosed semiconductor package than can be cut according to conventional semiconductor packages, resulting in a reduction in manufacturing cost. In addition, the conventional semiconductor packages use the molding to encapsulate the package. However, the dielectric constant of the molding is relatively high, which causes relatively high parasitic effect (e.g., parasitic capacitance or parasitic resistance) in the conventional semiconductor packages. Furthermore, in the conventional semiconductor packages, the electrical connection of the die to the substrate is implemented by means of metal wirings. The length of the metal wirings is relatively longer in the conventional semiconductor packages as compared to the metal wirings of the disclosed semiconductor package, resulting in increased parasitic effect under the conventional semiconductor packages. Therefore, when the die operates at high frequency, the die may be affected by the parasitic effect, limiting improvement of the electrical performance. In addition, the packaging of the semiconductor package may require several connecting interfaces, which increases the complexity of the packing process. Furthermore, the packaging of the die also involves complicated processes (e.g., die bonding, wire bonding and molding), in addition to using a lead frame or a substrate of the printed circuit board to carry the die. Accordingly, the cost cannot be effectively reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, wherein similar reference numbers refer to similar elements.

DETAILED DESCRIPTION

Figure 1:
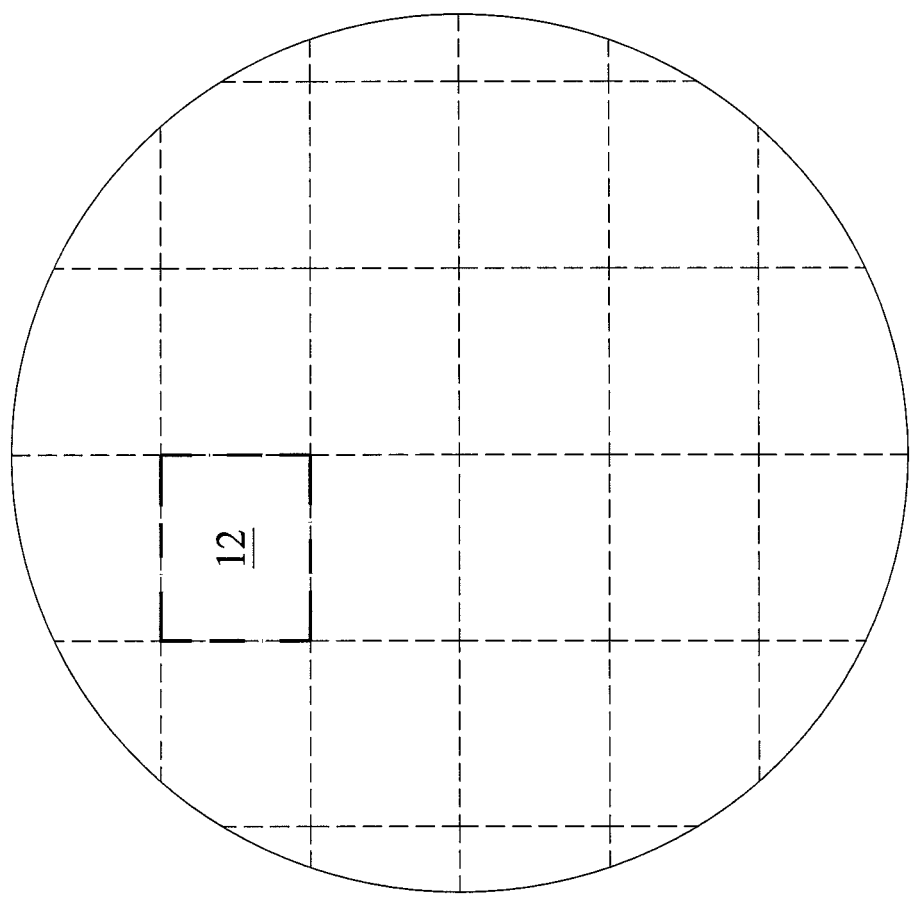
FIG. 1 schematically illustrates an exemplary configuration of a wafer in the related art.

The present disclosed embodiments and examples as shown in the figures are illustrated by using particular language. It should be understood that no limitation of the scope of the present disclosure is thereby intended. Any alterations and any modifications disclosed in the embodiment, as well as any further applications of the principles disclosed in the description, shall be deemed to be common knowledge for those skilled in the art. The reference numerals may be repeated throughout the embodiments, but this does not necessarily require that the features of one embodiment apply to another embodiment, even if they share the same reference numeral. It will be understood that when an element is referred to as being "connected to" or "coupled with" another element, it may be regarded as being directly connected or being coupled to another element, or intervening elements may exist therebetween.

Moreover, spatial relation terms, such as "below," "under," "beneath," "above," "over," "on," and the like, may be used herein for ease of description of the specification to describe a relative relationship between an element (or a feature) and another element(s) (or feature(s)) as shown in the figures. In addition to the depicted position in the figures, descriptions about these spatially related terms are implied to cover the different positions of the device in use or in operation. The device may be orientated in other ways (i.e. rotated 90 degrees or others) and these terms regarding the space used in the description may be interpreted in accordingly similar ways.

FIG. 1 schematically illustrates an exemplary configuration of a wafer 10 in the related art. Referring to FIG. 1, the wafer 10 comprises a plurality of dies 12. Generally, the size of the die 12 is determined by the package size of the die after the packaging for complying with the specified size of the specification. Therefore, when the package size of the specification is the standard size 0201, the size of the die 12 will be substantially equal to the standard size 0201, wherein the standard size 0201 indicates a length of 600 um, a width of 300 um, and a height of 300 um, with a deviation of ±100 um for each dimension. Likewise, when the package size of the specification is the standard size 0402, the size of the die 12 will be substantially equal to the standard size 0402, wherein the standard size 0402 indicates a length of 1000 um, a width of 500 um, and a height of 500 um, with a deviation of ±200 um for each dimension. Similarly, when the package size of the specification is the standard size DFN10, the size of the die 12 will be substantially equal to the standard size DFN10, wherein the standard size DFN10 indicates a length of 2500 um, a width of 1000 um, and a height of 500 um, with a deviation of ±200 um for each dimension. In practice, some elements are incorporated into the package, and the size of the die 12 is therefore slightly smaller than the standard size 0402, but substantially equal to the standard size 0402. The standard sizes 0201 and 0402 are relatively large in size, so the size of the die 12 is correspondingly relatively large in size. Under a given area of the wafer 10, as the size of the die 12 is relatively larger, the number of dies 12 that can be cut from the wafer 10 is relatively limited.

Figure 2:
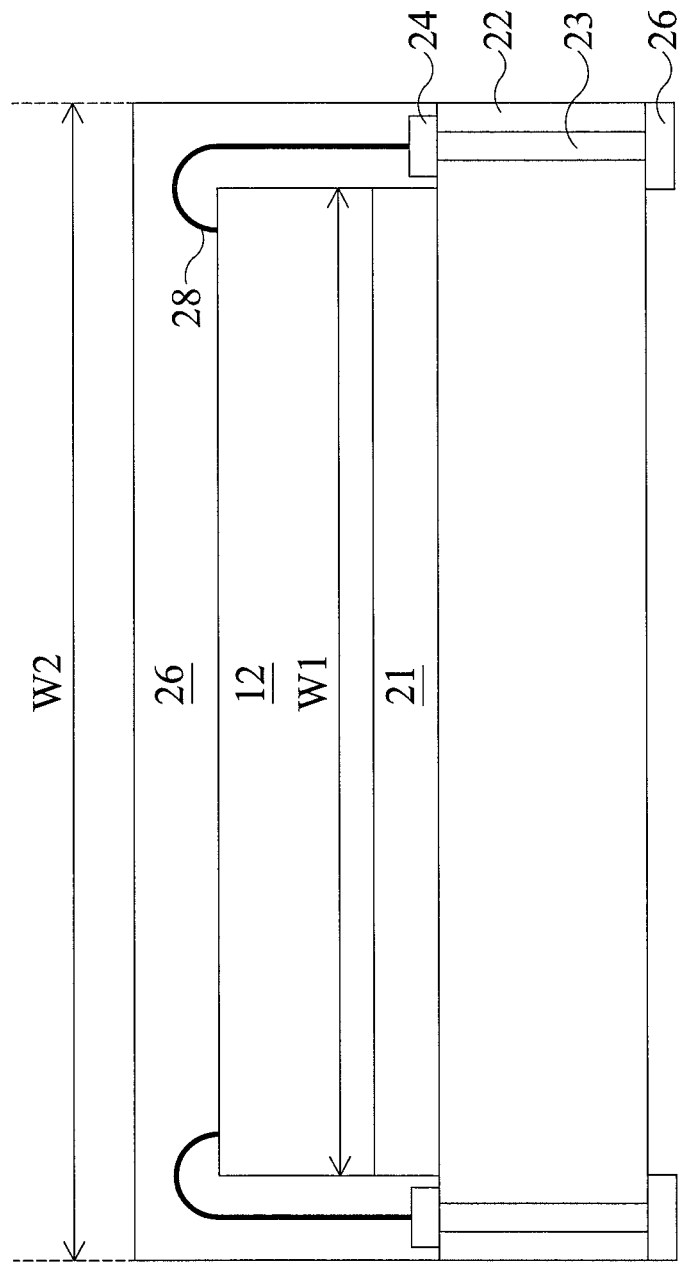
FIG. 2 schematically illustrates an exemplary configuration of a semiconductor package with the die in FIG. 1 in the related art.

FIG. 2 is a schematic view of a semiconductor package 20 with the die 12 in FIG. 1 in the related art. Referring to FIG. 2, in addition to the die 12, the semiconductor package 20 comprises a substrate 22, a plurality of metal wirings 28 and a molding 26. The die 12 is attached on the surface of the substrate 22 by an adhesive 21, and is electrically connected to a plurality of bonding pads 24 on the substrate 22 by the metal wirings 28. The substrate 22 comprises a plurality of conductive vias 23 to electrically connect the bonding pads 24 and connecting pads 25 under the substrate 22, and the connecting pads 25 may combine the solder ball (not shown in the drawings) to form a ball grid array (BGA) packaging. For protecting the die 12 and the metal wirings 28 from being damaged, the molding 26 covers the die 12 and the metal wirings 28 to isolate them from the environment. Referring to FIG. 1 and FIG. 2, the size of the die 12 (e.g. width W1) and the size of the semiconductor package 20 (e.g. width W2) are substantially the same.

In preparing the semiconductor package 20 shown in FIG. 2, the die 12 is attached to the top of the substrate 22, a wire bonding is performed, and the solder balls are formed on the back of the substrate 12 where the connecting pad 25 is disposed for electrically connecting an external electrical component. Generally, under such condition, the molding 26 has a relatively high dielectric constant, which may cause a serious parasitic effect (e.g. parasitic capacitance or parasitic resistance). In addition, the metal wiring 28 is relatively longer, which may also cause the parasitic effect. Hence, when the die 12 operates at high frequency, the die 12 may be affected by the parasitic effect so that the electrical performance cannot be improved. Moreover, the semiconductor package 20 may require several connecting interfaces, which increase the complexity of the process. The packaging of the die 12 not only requires complicated processes (e.g., die bonding, wire bonding and molding, etc.), but also requires using a lead frame or a substrate of the printed circuit board to carry the die 12. Accordingly, the cost cannot be effectively reduced.

Figure 3:
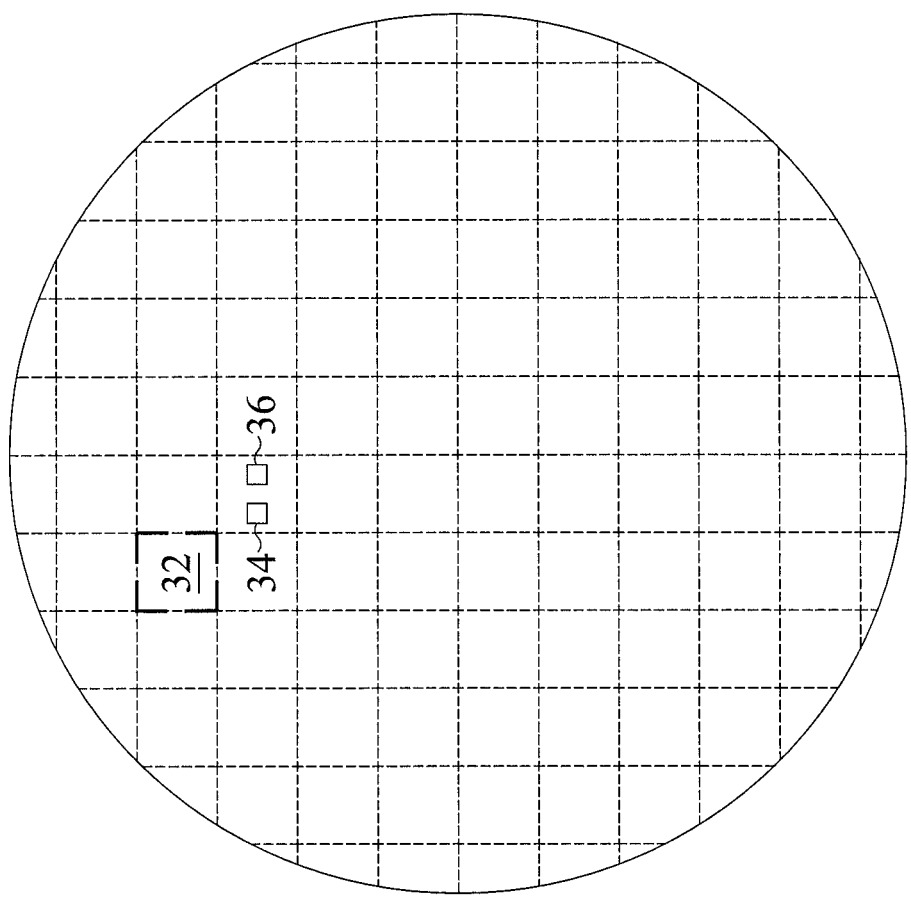
FIGS. 3 to 9 are cross-sectional views illustrating processes for a method for preparing a semiconductor package, in accordance with some embodiments of the present disclosure.
Figure 4:
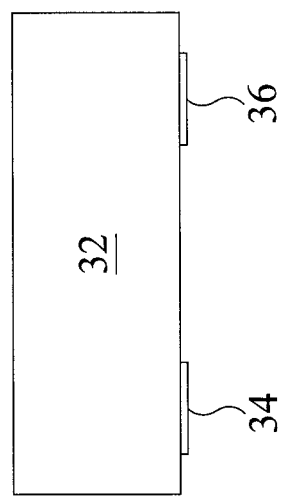

FIGS. 3 to 9 are cross-sectional views illustrating a method for preparing a semiconductor package 90 in accordance with some embodiments of the present disclosure. Referring to FIG. 3, a wafer 30 is provided, and a die 32 is formed on the wafer 30. In some embodiments, the size of the die 32 is much smaller than the standard size 0201. In some embodiments, the size of the die 32 is much smaller than the standard size 0402. In some embodiments, the size of the die 32 is much smaller than the standard size DFN10. In some embodiments, the size of the die 32 is smaller than one-half of the standard size 0201. In some embodiments, the size of the die 32 is smaller than approximately 3% of the standard size 0201. In some embodiments, the size of the die 32 is smaller than one-third of the standard size 0201. In some embodiments, the size of the die 32 is the standard size 01005, wherein the standard size 01005 indicates a length of 300 um, a width of 160 um and a height of 100 um. In some embodiments, a connecting pad 34 and a connecting pad 36 are formed on the die 32. In some embodiments, the size of the die 32 can be 4 mil, 6 mil or 8 mil. For simplified illustration, only the connecting pad 34 and the connecting pad 36 are shown on the die 32. Referring to FIG. 4, the die 32 is singulated from the wafer 30. In other words, each of the dies 32 is separated respectively through the singulation process.

In some embodiments, the die 32 is a transient voltage suppressor (TVS). In other embodiments, the die 32 may be logic dies (e.g. center processing unit (CPU), microcontroller, etc.), memory dies (e.g. dynamic random access memory (DRAM) die, static random access memory (SRAM) die, etc.), power management dies (e.g. power management integrated circuit (PMIC)), radio frequency (RF) dies, sensor dies, micro-electro-mechanical-system (MEMS) dies, signal processing dies (e.g. digital signal processing (DPS) dies), front-end dies (e.g. analog front-end (AFE) dies), the like, or combinations thereof. In some embodiments, the dies 32 may have different sizes or the same size, wherein all sizes are much smaller than the standard size 0201.

Figure 5:
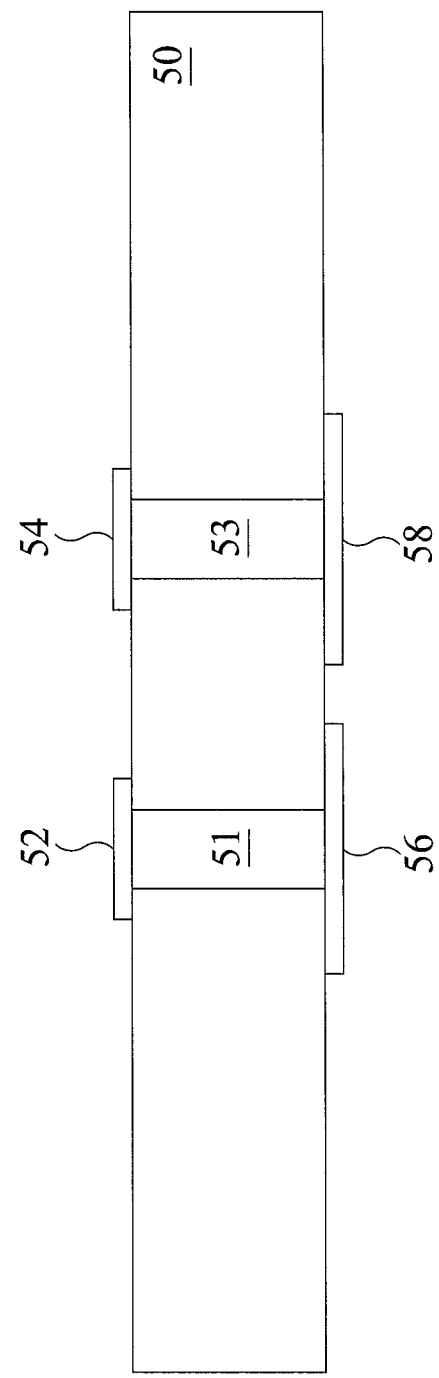

Referring to FIG. 5, a carrier substrate 50 is provided, and a bonding pad 52 and a bonding pad 54 are disposed on a first surface of the carrier substrate 50. A bonding pad 56 and a bonding pad 58 are disposed on a second surface of the carrier substrate 50, which is opposite to the first surface, for electrically connecting the external electrical component outside the semiconductor package 90. The carrier substrate 50 has a conductive via 51 and conductive via 53, the conductive via 51 electrically connects the bonding pad 52 and the bonding pad 56, and the conductive via 53 electrically connects the bonding pad 54 and the bonding pad 58. In some embodiments, the carrier substrate 50 includes a conductive carrier and a non-conductive carrier. In some embodiments, the conductive carrier includes a printed circuit board (PCB). In other embodiments, the carrier substrate 50 may be the glass carrier, the ceramic carrier or the like. In some embodiments, the carrier substrate 50 is not the semiconductor carrier. Specifically, the carrier substrate 50 is not the doped or un-doped silicon substrate or the semiconductor-on-insulator (SOI) substrate.

Figure 6:
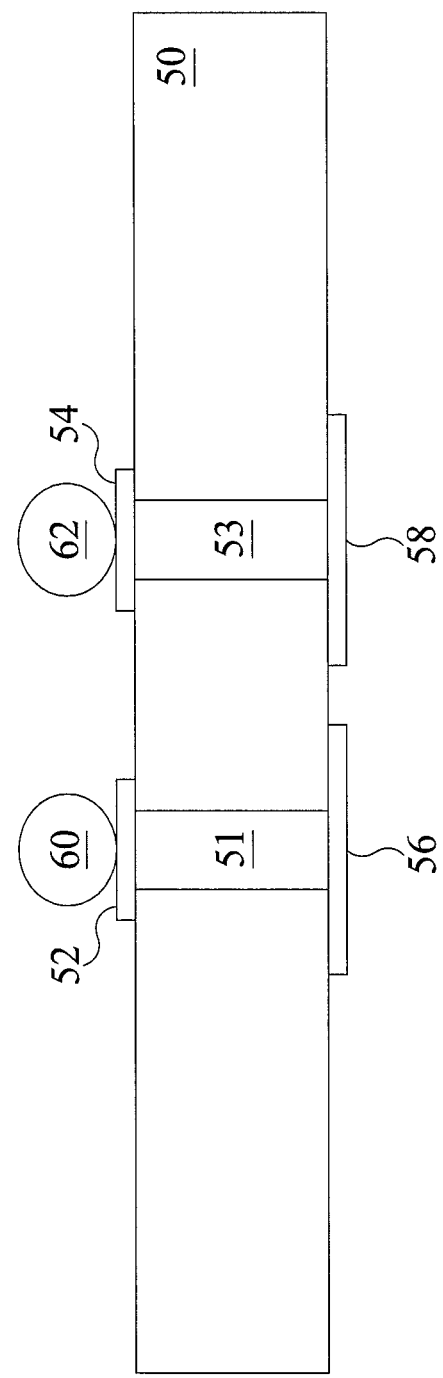

Referring to FIG. 6, a conductive element 60 and a conductive element 62 are formed on the carrier substrate 50. More specifically, the conductive elements 60 and 62 are formed on the bonding pads 52 and 54 of the carrier substrate 50, respectively. In some embodiments, a paste printing process or screen printing process is performed for forming the conductive element 60 and the conductive element 62. In some embodiments, in the process of performing a paste printing or screen printing, the printing materials may include silver or tin. In some embodiments, the printing material may include conductive paste (e.g. transparent conducting oxide, TCO), graphene, or other available materials. In some embodiments, the forming of the conductive elements 60 and 62 uses the stamping process or the dispensing process. In some embodiments, the conductive elements 60 and 62 include solder ball, silver paste and solder paste. In this embodiment, the conductive elements 60 and 62 are disposed on the middle of the bonding pads 52 and 54 respectively, but the disclosure is not limited thereto.

Figure 7:
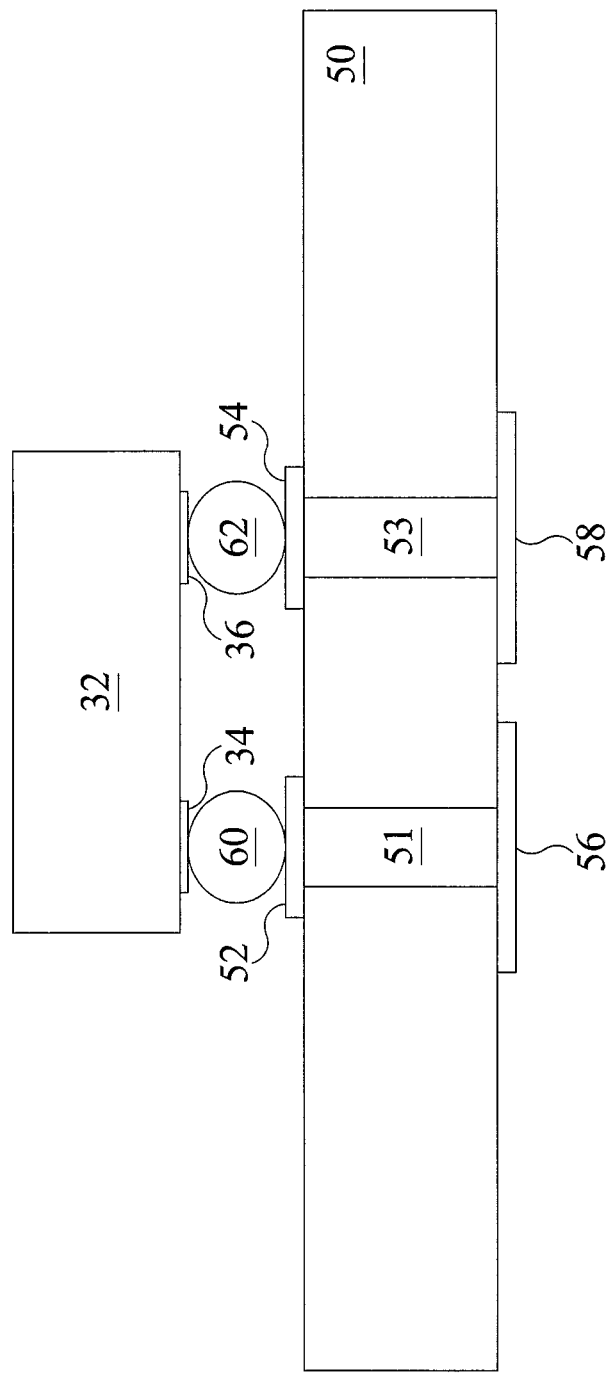

Referring to FIG. 7, the die 32 is attached to the conductive elements 60 and 62. More specifically, the connecting pads 34 and 36 on the die 32 align with the conductive elements 60 and 62, respectively, and the connecting pads 34 and 36 of the die 32 are electrically connected to the conductive elements 60 and 62, respectively. The electrical connection of the die 32 to the carrier substrate 50 is implemented by the conductive elements 60 and 62, and is achieved without using a wiring such as the metal wiring 28 as shown in FIG. 2.

The conductive element 60 is disposed on the bonding pad 52 and attached to an end of the connecting pad 34, and the conductive element 62 is disposed on the bonding pad 54 and attached to an end of the connecting pad 36. Accordingly, even if the dimension of the die 32 is reduced and the distance between the connecting pads 32 and 34 becomes smaller, the present disclosure is still applicable without changing the design of the bonding pads 52 and 54 on the carrier substrate 50. Therefore, the manufacturing process is simpler.

Figure 8:
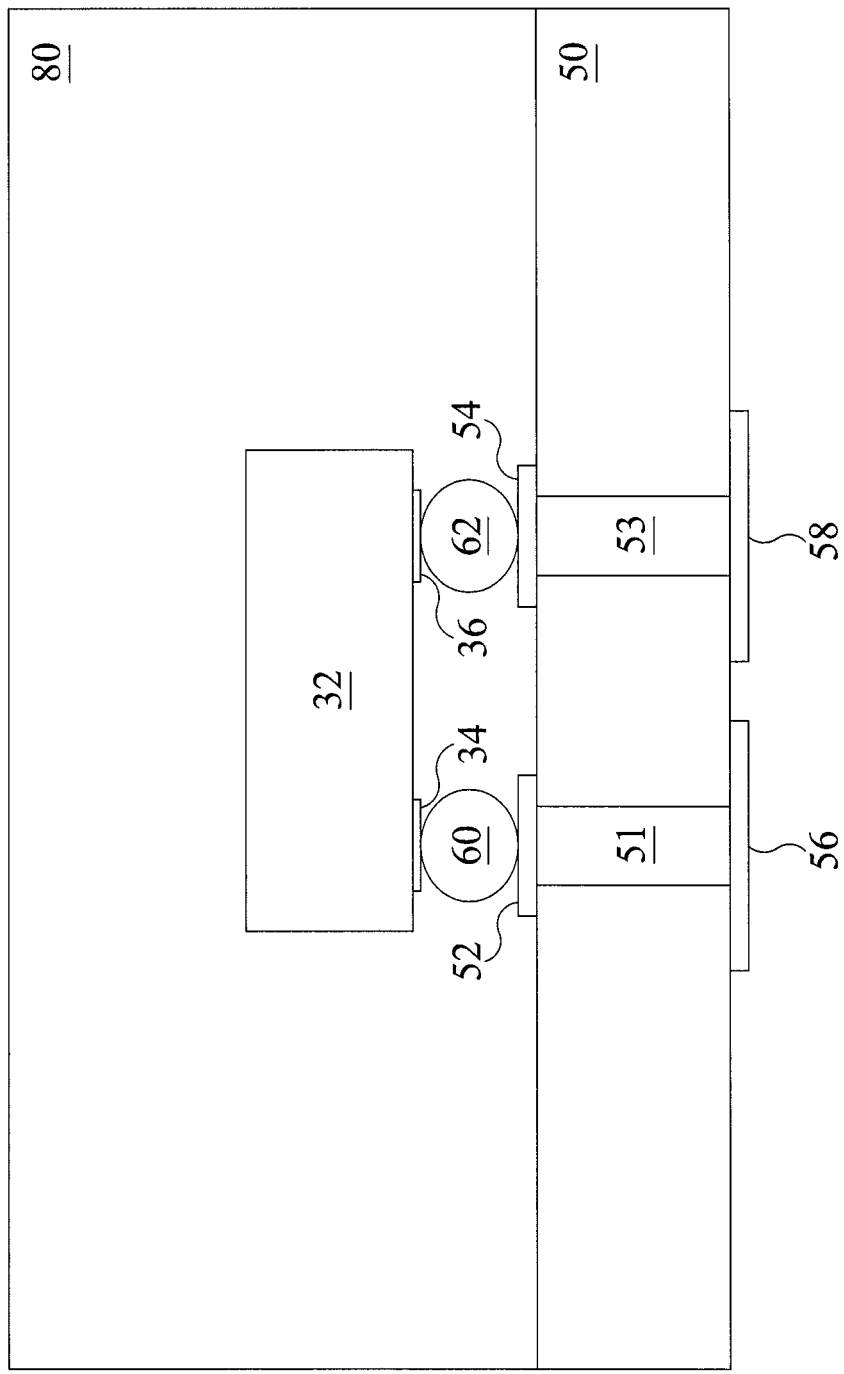

Referring to FIG. 8, a packing member 80 is used to encapsulate the die 32, the connecting pads 34 and 36, the conductive elements 60 and 62, and the bonding pads 52 and 54. In actual operation, the resulting structure (encapsulated die) after the encapsulation may include a plurality of dies 32, rather than only one die 32. In FIG. 8, only one die 32 is shown for simplifying the illustration. In some embodiments, different from FIG. 2 wherein a molding process is used to encapsulate the die 12, the present disclosure uses a protective material such as a dry film process to encapsulate the die 32. After a curing process, the packing member 80 encapsulates the die 32 and prevents the carrier substrate 50 from cracking. In some embodiments, the protecting material includes polyimide, epoxy, benzocyclobutene (BCB), polymer, or other available materials. In some embodiments, the protecting material includes liquid photo-resist.

Figure 9:
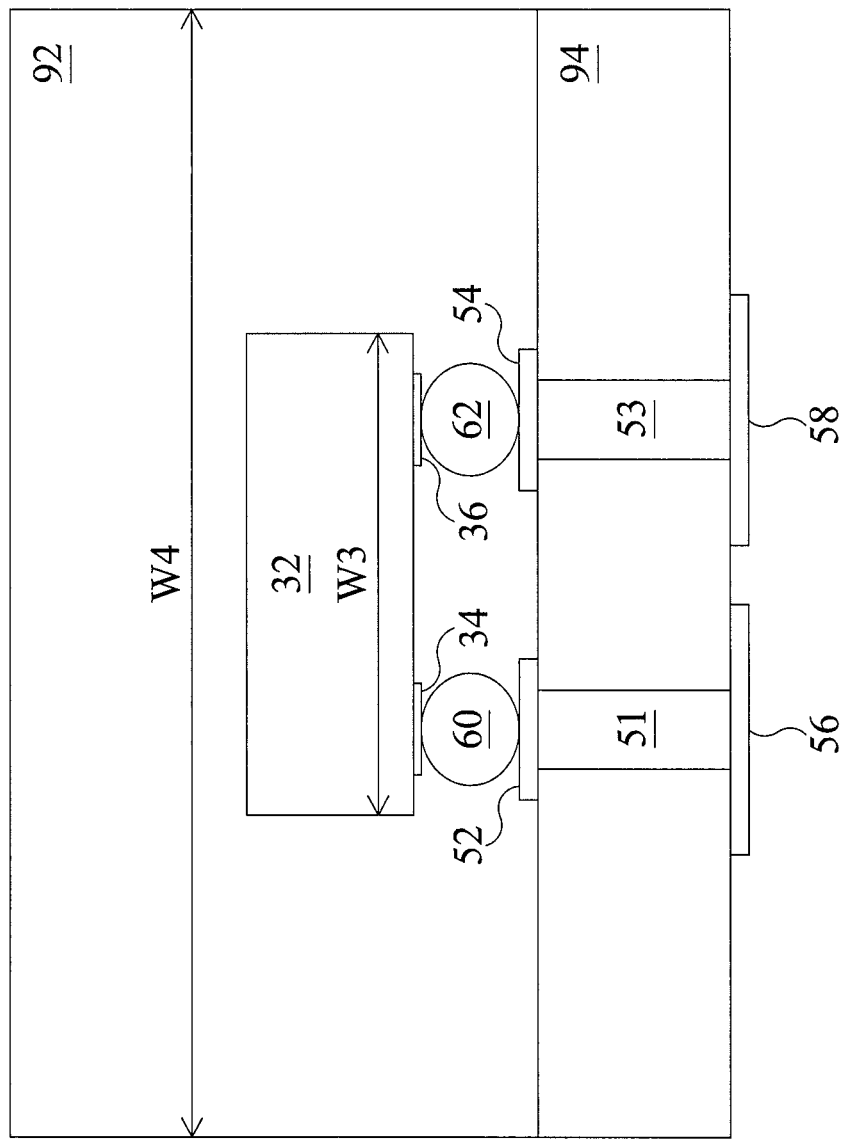

Referring to FIG. 9, the encapsulated structure of the die 32 (the overall structure as shown in FIG. 8) is singulated to form a semiconductor package 90. In other words, the semiconductor package 90 includes the die 32. The carrier substrate 50 is singulated to form a singulated substrate 94, and the packing member 80 is singulated to form a singulated packing member 92. In some embodiments, the size of the semiconductor package 90 is equal to the standard size 0201. In some embodiments, the size of the semiconductor package 90 is equal to the standard size 0402. In some embodiments, the size of the semiconductor package 90 is equal to the standard size DFN10. The size of the die 32, such as the width W3, is much smaller than the size of the semiconductor package 90, such as the width W4. The size of the semiconductor package 90, such as the width W4, is substantially the same as the standard size 0201. In the present embodiment, the disclosed method for preparing a semiconductor package can prepare a semiconductor package with the standard size 0201 (or standard size 0402, or standard size DFN10) by singulating the wafer with a larger number of smaller dies in the limited area, and the dies from the singulated wafer can be used to prepare the semiconductor package with the desired size. In view of this, the present method for preparing a semiconductor package can reduce cost.

Figure 10:
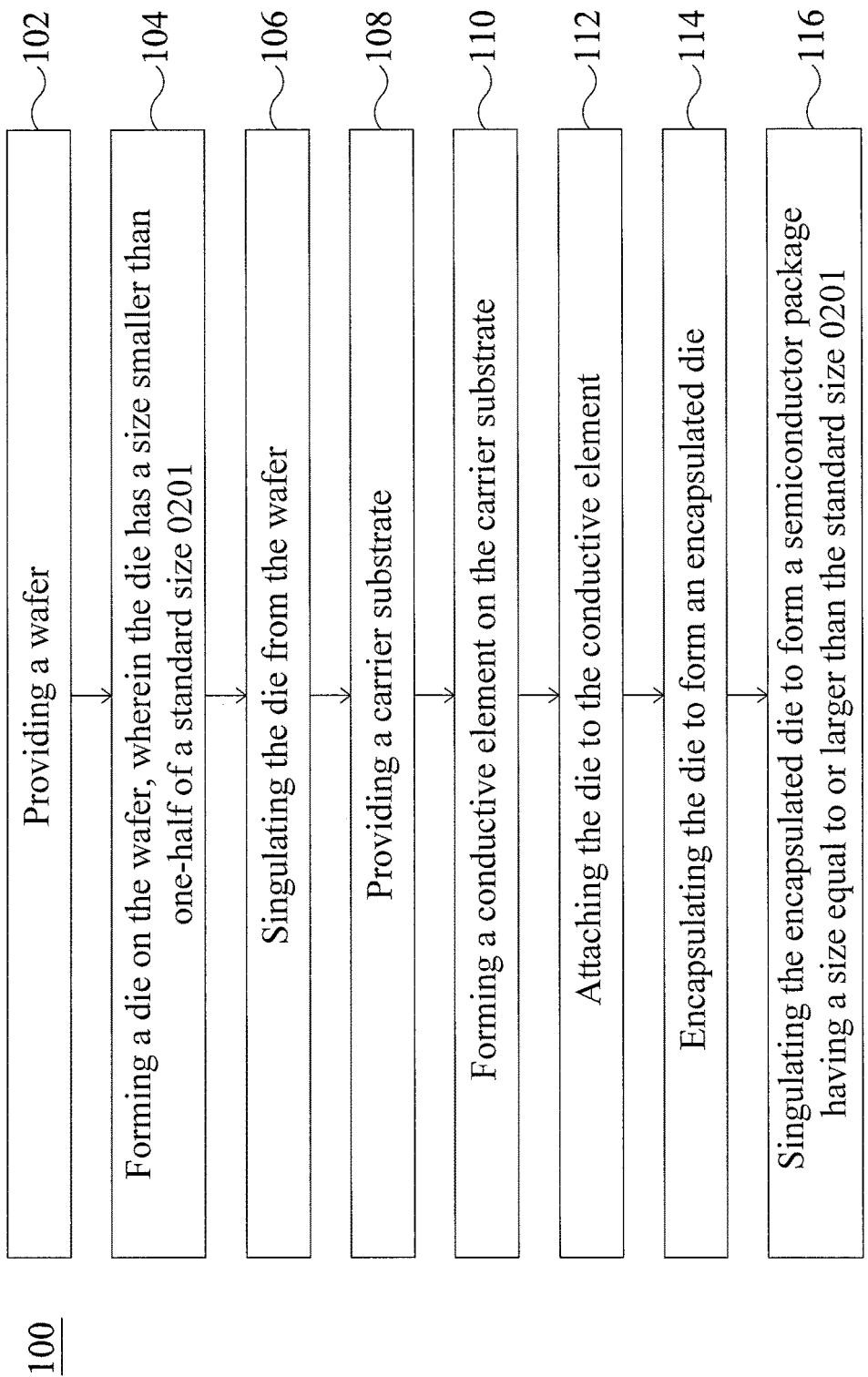
FIG. 10 is a flowchart for a method for preparing a semiconductor package, in accordance with some embodiments of the present disclosure.

FIG. 10 is a flowchart for a method 100 for preparing a semiconductor package, in accordance with some embodiments of the present disclosure. Referring to FIG. 10, the method 100 includes a number of operations and the description and illustration are not deemed as a limitation to the sequence of the operations. The method 100 includes a number of operations (102, 104, 106, 108, 110, 112, 114 and 116). At the beginning of the method 100 is the operation 102 of providing a wafer. The operation 104 follows the operation 102 and forms a die on the wafer, wherein the die has a size smaller than one-half of the standard size 0201. The operation 106 follows the operation 104 and singulating the die from the wafer. The operation 108 follows the operation 106 and provides a carrier substrate. The operation 110 follows the operation 108 and forms a conductive element on the carrier substrate. The operation 112 follows the operation 110 and attaches the die to the conductive element. The operation 114 follows the operation 112 and encapsulates the die to form an encapsulated die. The operation 116 follows the operation 114 and singulating the encapsulated die to form a semiconductor package having a size equal to or larger than the standard size 0201.

FIG. 1 schematically illustrates an exemplary configuration of a wafer 10 in the related art. Referring to FIG. 1, the wafer 10 comprises a plurality of dies 12. Generally, the size of the die 12 is determined by the package size of the die after the packaging for complying with the specified size of the specification. Therefore, when the package size of the specification is the standard size 0201, the size of the die 12 will be substantially equal to the standard size 0201, wherein the standard size 0201 indicates a length of 600 um, a width of 300 um, and a height of 300 um, with a deviation of ±100 um for each dimension. Likewise, when the package size of the specification is the standard size 0402, the size of the die 12 will be substantially equal to the standard size 0402, wherein the standard size 0402 indicates a length of 1000 um, a width of 500 um, and a height of 500 um, with a deviation of ±200 um for each dimension. Similarly, when the package size of the specification is the standard size DFN10, the size of the die 12 will be substantially equal to the standard size DFN10, wherein the standard size DFN10 indicates a length of 2500 um, a width of 1000 um, and a height of 500 um, with a deviation of ±200 um for each dimension. In practice, some elements are incorporated into the package, and the size of the die 12 is therefore slightly smaller than the standard size 0402, but substantially equal to the standard size 0402. The standard sizes 0201 and 0402 are relatively large in size, so the size of the die 12 is correspondingly relatively large in size. Under a given area of the wafer 10, as the size of the die 12 is relatively larger, the number of dies 12 that can be cut from the wafer 10 is relatively limited.

FIG. 2 is a schematic view of a semiconductor package 20 with the die 12 in FIG. 1 in the related art. Referring to FIG. 2, in addition to the die 12, the semiconductor package 20 comprises a substrate 22, a plurality of metal wirings 28 and a molding 26. The die 12 is attached on the surface of the substrate 22 by an adhesive 21, and is electrically connected to a plurality of bonding pads 24 on the substrate 22 by the metal wirings 28. The substrate 22 comprises a plurality of conductive vias 23 to electrically connect the bonding pads 24 and connecting pads 25 under the substrate 22, and the connecting pads 25 may combine the solder ball (not shown in the drawings) to form a ball grid array (BGA) packaging. For protecting the die 12 and the metal wirings 28 from being damaged, the molding 26 covers the die 12 and the metal wirings 28 to isolate them from the environment. Referring to FIG. 1 and FIG. 2, the size of the die 12 (e.g. width W1) and the size of the semiconductor package 20 (e.g. width W2) are substantially the same.

In preparing the semiconductor package 20 shown in FIG. 2, the die 12 is attached to the top of the substrate 22, a wire bonding is performed, and the solder balls are formed on the back of the substrate 12 where the connecting pad 25 is disposed for electrically connecting an external electrical component. Generally, under such condition, the molding 26 has a relatively high dielectric constant, which may cause a serious parasitic effect (e.g. parasitic capacitance or parasitic resistance). In addition, the metal wiring 28 is relatively longer, which may also cause the parasitic effect. Hence, when the die 12 operates at high frequency, the die 12 may be affected by the parasitic effect so that the electrical performance cannot be improved. Moreover, the semiconductor package 20 may require several connecting interfaces, which increase the complexity of the process. The packaging of the die 12 not only requires complicated processes (e.g., die bonding, wire bonding and molding, etc.), but also requires using a lead frame or a substrate of the printed circuit board to carry the die 12. Accordingly, the cost cannot be effectively reduced.

FIGS. 3 to 9 are cross-sectional views illustrating a method for preparing a semiconductor package 90 in accordance with some embodiments of the present disclosure. Referring to FIG. 3, a wafer 30 is provided, and a die 32 is formed in and on the wafer 30. In some embodiments, the size of the die 32 is much smaller than the standard size 0201. In some embodiments, the size of the die 32 is much smaller than the standard size 0402. In some embodiments, the size of the die 32 is much smaller than the standard size DFN10. In some embodiments, the size of the die 32 is smaller than one-half of the standard size 0201. In some embodiments, the size of the die 32 is smaller than approximately 3% of the standard size 0201. In some embodiments, the size of the die 32 is smaller than one-third of the standard size 0201. In some embodiments, the size of the die 32 is the standard size 01005, wherein the standard size 01005 indicates a length of 300 um, a width of 160 um and a height of 100 um. In some embodiments, a connecting pad 34 and a connecting pad 36 are formed on the die 32. In some embodiments, the size of the die 32 can be 4 mil, 6 mil or 8 mil. For simplified illustration, only the connecting pad 34 and the connecting pad 36 are shown on the die 32. Referring to FIG. 4, the wafer 30 is singulated to acquire the die 32. In other words, each of the dies 32 is separated respectively through the singulation process.

In some embodiments, the die 32 is a transient voltage suppressor (TVS). In other embodiments, the die 32 may be logic dies (e.g. center processing unit (CPU), microcontroller, etc.), memory dies (e.g. dynamic random access memory (DRAM) die, static random access memory (SRAM) die, etc.), power management dies (e.g. power management integrated circuit (PMIC)), radio frequency (RF) dies, sensor dies, micro-electro-mechanical-system (MEMS) dies, signal processing dies (e.g. digital signal processing (DPS) dies), front-end dies (e.g. analog front-end (AFE) dies), the like, or combinations thereof. In some embodiments, the dies 32 may have different sizes or the same size, wherein all sizes are much smaller than the standard size 0201.

Referring to FIG. 5, a carrier substrate 50 is provided, and a bonding pad 52 and a bonding pad 54 are disposed on a first surface of the carrier substrate 50. A bonding pad 56 and a bonding pad 58 are disposed on a second surface of the carrier substrate 50, which is opposite to the first surface, for electrically connecting the external electrical component outside the semiconductor package 90. The carrier substrate 50 has a conductive via 51 and conductive via 53, the conductive via 51 electrically connects the bonding pad 52 and the bonding pad 56, and the conductive via 53 electrically connects the bonding pad 54 and the bonding pad 58. In some embodiments, the carrier substrate 50 includes a conductive carrier and a non-conductive carrier. In some embodiments, the conductive carrier includes a printed circuit board (PCB). In other embodiments, the carrier substrate 50 may be the glass carrier, the ceramic carrier or the like. In some embodiments, the carrier substrate 50 is not the semiconductor carrier. Specifically, the carrier substrate 50 is not the doped or un-doped silicon substrate or the semiconductor-on-insulator (SOI) substrate.

Referring to FIG. 6, a conductive element 60 and a conductive element 62 are formed on the carrier substrate 50. More specifically, the conductive elements 60 and 62 are formed on the bonding pads 52 and 54 of the carrier substrate 50, respectively. In some embodiments, a paste printing process or screen printing process is performed for forming the conductive element 60 and the conductive element 62. In some embodiments, in the process of performing a paste printing or screen printing, the printing materials may include silver or tin. In some embodiments, the printing material may include conductive paste (e.g. transparent conducting oxide, TCO), graphene, or other available materials. In some embodiments, the forming of the conductive elements 60 and 62 uses the stamping process or the dispensing process. In some embodiments, the conductive elements 60 and 62 include solder ball, silver paste and solder paste. In this embodiment, the conductive elements 60 and 62 are disposed on the middle of the bonding pads 52 and 54 respectively, but the disclosure is not limited thereto.

Referring to FIG. 7, the die 32 is attached to the conductive elements 60 and 62. More specifically, the connecting pads 34 and 36 on the die 32 align with the conductive elements 60 and 62, respectively, and the connecting pads 34 and 36 of the die 32 are electrically connected to the conductive elements 60 and 62, respectively. The electrical connection of the die 32 to the carrier substrate 50 is implemented by the conductive elements 60 and 62, and is achieved without using a wiring such as the metal wiring 28 as shown in FIG. 2.

The conductive element 60 is disposed on the bonding pad 52 and attached to an end of the connecting pad 34, and the conductive element 62 is disposed on the bonding pad 54 and attached to an end of the connecting pad 36. Accordingly, even if the dimension of the die 32 is reduced and the distance between the connecting pads 32 and 34 becomes smaller, the present disclosure is still applicable without changing the design of the bonding pads 52 and 54 on the carrier substrate 50. Therefore, the manufacturing process is simpler.

Referring to FIG. 8, a packing member 80 is used to encapsulate the die 32, the connecting pads 34 and 36, the conductive elements 60 and 62, and the bonding pads 52 and 54. In actual operation, the resulting structure after the encapsulation includes a plurality of dies 32, rather than only one die 32. In FIG. 8, only one die 32 is shown for simplifying the illustration. In some embodiments, different from FIG. 2 wherein a molding process is used to encapsulate the die 12, the present disclosure uses a protective material such as a dry film process to encapsulate the die 32. After a curing process, the packing member 80 encapsulates the die 32 and prevents the carrier substrate 50 from cracking. In some embodiments, the protecting material includes polyimide, epoxy, benzocyclobutene (BCB), polymer, or other available materials. In some embodiments, the protecting material includes liquid photo-resist.

Referring to FIG. 9, the encapsulated structure of the die 32 (the overall structure as shown in FIG. 8) is singulated to form a semiconductor package 90. In other words, the semiconductor package 90 includes the die 32. The carrier substrate 50 is singulated to form a singulated substrate 94, and the packing member 80 is singulated to form a singulated packing member 92. In some embodiments, the size of the semiconductor package 90 is equal to the standard size 0201. In some embodiments, the size of the semiconductor package 90 is equal to the standard size 0402. In some embodiments, the size of the semiconductor package 90 is equal to the standard size DFN10. The size of the die 32, such as the width W3, is much smaller than the size of the semiconductor package 90, such as the width W4. The size of the semiconductor package 90, such as the width W4, is substantially the same as the standard size 0201. In the present embodiment, the disclosed method for preparing a semiconductor package can prepare a semiconductor package with the standard size 0201 (or standard size 0402, or standard size DFN10) by singulating the wafer with a larger number of smaller dies in the limited area, and the dies from the singulated wafer can be used to prepare the semiconductor package with the desired size. In view of this, the present method for preparing a semiconductor package can reduce cost.

FIG. 10 is a flowchart for a method 100 of manufacturing a semiconductor package, in accordance with some embodiments of the present disclosure. Referring to FIG. 10, the method 100 includes a number of operations and the description and illustration are not deemed as a limitation to the sequence of the operations. The method 500 includes a number of operations (102, 104, 106, 108, 110, 112, 114 and 116). At the beginning of the method 100 is the operation 102 of providing a wafer. The operation 104 follows the operation 102 and forms a die with a size smaller than one half of the standard size 0201 in and on the wafer. The operation 106 follows the operation 104 and dices the wafer to form the singulated die. The operation 108 follows the operation 106 and provides a carrier substrate. The operation 110 follows the operation 108 and forms a conductive element on the carrier substrate. The operation 112 follows the operation 110 and attaches the die to the conductive element. The operation 114 follows the operation 112 and encapsulates the die. The operation 116 follows the operation 114 and dices the encapsulated die to form a semiconductor package with a size equal to or larger than the standard size 0201.

One aspect of the present disclosure provides a method for preparing a semiconductor package. In one embodiment of the present disclosure, the method comprises steps of providing a wafer; forming a die on the wafer, wherein the die has a size smaller than one-half of a standard size 0201; dicing the die from the wafer; encapsulating the die to form an encapsulated die; and singulating the encapsulated die to form a semiconductor package having a size equal to or larger than the standard size 0201.

In the present disclosure, encapsulating the die is implemented by using the protecting materials of the dry film process, rather than the high dielectric constant materials. Accordingly, the parasitic effect is relatively insignificant. In addition, the present disclosure uses conductive elements instead of conducting wirings to form the electrical connection to the carrier substrate, so that the parasitic effect is not likely to occur. Consequently, when the die operates at high frequency, the parasitic effect to the die is relatively small, and the electrical performance can be improved correspondingly.

The disclosed method for preparing a semiconductor package can prepare a semiconductor package with the standard size 0201 (or standard size 0402, or standard size DFN10) by singulating the wafer with a larger number of smaller dies (smaller than the standard size 0201) in the limited area, and the dies from the singulated wafer can be used to prepare the semiconductor package with the desired size such as the standard size 0201. In view of this, the present method for preparing a semiconductor package can reduce cost.

In contrast, the conventional method for preparing a semiconductor package uses the molding for encapsulating the die. However, the dielectric constant of the molding is relatively high and causes serious parasitic effects (e.g., parasitic capacitance or parasitic resistance). Moreover, the electrical connection of the die to the carrier substrate is implemented by metal wirings. Hence, if the length of the metal wirings is relatively long, the parasitic effect occurs. Consequently, when the die operates at the high frequency, the die may be affected by the parasitic effect and the electrical performance cannot be improved. Furthermore, the packaging of the semiconductor package may require several connecting interfaces, which increases the complexity of the packing process. Furthermore, the packaging of the die also involves complicated processes (e.g., die bonding, wire bonding and molding), in addition to using a lead frame or using a substrate of the printed circuit board to carry the die. Accordingly, the cost cannot be effectively reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor package, the method comprising steps of:
    providing a wafer;
    forming a die on the wafer, wherein the die has a size smaller than one-half of a standard size 0201;
    dicing the die from the wafer;
    encapsulating the die to form an encapsulated die by a dry film process; and
    singulating the encapsulated die to form a semiconductor package having a size equal to or larger than the standard size 0201, wherein the standard size 0201 indicates a length of 600 um, a width of 300 um, and a height of 300 um, with a deviation of ±100 um for each dimension.

2. The method of claim 1, wherein the size of the die is a standard size 01005.

3. The method of claim 1, wherein the size of the semiconductor package is equal to or larger than a standard size 0402 or a standard size DFN 10.

4. The method of claim 1, comprising:
    providing a carrier substrate;
    forming a conductive element on the carrier substrate; and
    attaching the die to the conductive element.

5. The method of claim 4, wherein the step of encapsulating the die comprises using a protecting material to encapsulate the die.

6. The methods of claim 5, wherein the protecting material comprises polyimide, epoxy resin, benzocyclobutene (BCB) and polymer.

7. The method of claim 5, wherein the carrier substrate comprises a conductive carrier or a non-conductive carrier.

8. The method of claim 7, wherein the conductive carrier comprises a printed circuit board (PCB).

9. The method of claim 5, wherein the step of forming a conductive element on the carrier substrate comprises: performing a paste printing process or screen printing process to form a conductive element.

10. The method of claim 9, wherein the paste printing process or the screen printing process uses a material including silver or tin.

11. The method of claim 5, wherein the die is electrically connected to the carrier substrate through the conductive element.

* * * * *